(12) United States Patent
Du et al.

(10) Patent No.: US 8,693,586 B2
(45) Date of Patent: Apr. 8, 2014

(54) METHOD AND DEVICE FOR DEMODULATING COMPLEX CARRIERS

(75) Inventors: Fanping Du, Shenzhen (CN); Junyi Yang, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 0 days.

(21) Appl. No.: 13/641,393

(22) PCT Filed: May 30, 2011

(86) PCT No.: PCT/CN2011/074931
§ 371 (c)(1),
(2), (4) Date: Oct. 15, 2012

(87) PCT Pub. No.: WO2012/048572
PCT Pub. Date: Apr. 19, 2012

(65) Prior Publication Data
US 2013/0034193 A1 Feb. 7, 2013

(30) Foreign Application Priority Data
Oct. 16, 2010 (CN) .......................... 2010 1 0540472

(51) Int. Cl.
*H04L 27/06* (2006.01)
*H03D 1/00* (2006.01)
(52) U.S. Cl.
USPC .......................................... 375/340; 375/316
(58) Field of Classification Search
CPC ................................................ H04L 27/2649
USPC ......................................................... 375/340
See application file for complete search history.

(56) References Cited

U.S. PATENT DOCUMENTS

| 5,909,462 | A | * | 6/1999 | Kamerman et al. | 375/147 |
| 6,426,977 | B1 | * | 7/2002 | Lee et al. | 375/259 |
| 2003/0204309 | A1 | * | 10/2003 | Soellner | 701/214 |
| 2007/0183304 | A1 | | 8/2007 | Jeong | |
| 2009/0067833 | A1 | * | 3/2009 | Bunge et al. | 398/43 |
| 2010/0027690 | A1 | * | 2/2010 | Liang et al. | 375/260 |

FOREIGN PATENT DOCUMENTS

| CN | 1976329 A | 6/2007 |
| CN | 101521773 A | 9/2009 |
| CN | 101741788 A | 6/2010 |
| WO | 2005032087 A1 | 4/2005 |

OTHER PUBLICATIONS

International Search Report in international application No. PCT/CN2011/074931, mailed on Sep. 1, 2011.
English Translation of the Written Opinion of the International Search Authority in international application No. PCT/CN2011/074931, mailed on Sep. 1, 2011.

* cited by examiner

*Primary Examiner* — Erin File
(74) *Attorney, Agent, or Firm* — Oppedahl Patent Law Firm LLC

(57) ABSTRACT

A method and device for complex carrier demodulation are provided by the disclosure. The method includes: demodulating modulated signals using complex signals $e^{-i\omega t}$ or $e^{i\omega t}$ as carrier signals to obtain complex carrier demodulation signals. Therefore, the utilization rate of spectrums is improved. With the method for complex carrier demodulation provided by the disclosure, the left and right frequency spectrum resources are fully utilized, the loss of signal energy is little, thereby the channel capacity is improved greatly.

15 Claims, 16 Drawing Sheets

Fig. 3

| E-UTRA operating frequency band | Uplink (UL) operating frequency band BS receive UE transmit | | | Downlink (DL) operating frequency band BS transmit UE receive | | | Duplex Mode |
|---|---|---|---|---|---|---|---|
| | $F_{UL\_low}$ | – | $F_{UL\_high}$ | $F_{DL\_low}$ | – | $F_{DL\_high}$ | |
| 1 | 1920 MHz | – | 1980 MHz | 2110 MHz | – | 2170 MHz | FDD |
| 2 | 1850 MHz | – | 1910 MHz | 1930 MHz | – | 1990 MHz | FDD |
| 3 | 1710 MHz | – | 1785 MHz | 1805 MHz | – | 1880 MHz | FDD |
| 4 | 1710 MHz | – | 1755 MHz | 2110 MHz | – | 2155 MHz | FDD |
| 5 | 824 MHz | – | 849 MHz | 869 MHz | – | 894 MHz | FDD |
| 6 | 830 MHz | – | 840 MHz | 875 MHz | – | 885 MHz | FDD |
| 7 | 2500 MHz | – | 2570 MHz | 2620 MHz | – | 2690 Hz | FDD |
| 8 | 880 MHz | – | 915 MHz | 925 MHz | – | 960 MHz | FDD |
| 9 | 1749.9 MHz | – | 1784.9 MHz | 1844.9 MHz | – | 1879.9 MHz | FDD |
| 10 | 1710 MHz | – | 1770 MHz | 2110 MHz | – | 2170 MHz | FDD |
| 11 | 1427.9 MHz | – | 1452.9 MHz | 1475.9 MHz | – | 1500.9 MHz | FDD |
| 12 | 698 MHz | – | 716 MHz | 728 MHz | – | 746 MHz | FDD |
| 13 | 777 MHz | – | 787 MHz | 746 MHz | – | 756 MHz | FDD |
| 14 | 788 MHz | – | 798 MHz | 758 MHz | – | 768 MHz | FDD |
| 17 | 704 MHz | – | 716 MHz | 734 MHz | – | 746 MHz | FDD |
| ... | | | | | | | |
| 33 | 1900 MHz | – | 1920 MHz | 1900 MHz | – | 1920 MHz | TDD |
| 34 | 2010 MHz | – | 2025 MHz | 2010 MHz | – | 2025 MHz | TDD |
| 35 | 1850 MHz | – | 1910 MHz | 1850 MHz | – | 1910 MHz | TDD |
| 36 | 1930 MHz | – | 1990 MHz | 1930 MHz | – | 1990 MHz | TDD |
| 37 | 1910 MHz | – | 1930 MHz | 1910 MHz | – | 1930 MHz | TDD |
| 38 | 2570 MHz | – | 2620 MHz | 2570 MHz | – | 2620 MHz | TDD |
| 39 | 1880 MHz | – | 1920 MHz | 1880 MHz | – | 1920 MHz | TDD |
| 40 | 2300 MHz | – | 2400 MHz | 2300 MHz | – | 2400 MHz | TDD |

METHOD AND DEVICE FOR DEMODULATING COMPLEX CARRIERS

TECHNICAL FIELD

The disclosure relates to a method for carrier demodulation, and more particularly, to a method and device for complex carrier demodulation.

BACKGROUND

According to Shannon formula $C=W \cdot \log_2^{1+S/N}$, where C is the channel capacity, W is the channel bandwidth, S is the signal power and N is the noise power, it can be seen that the channel capacity is proportional to the bandwidth, therefore the most effective method to improve the channel capacity is to increase the bandwidth. In addition, it can be seen that the channel capacity can be also improved by increasing the signal power.

In a current communication system, different information is carried on different frequency bands using carrier modulation technologies to be transmitted on the frequency bands, the essence of which is to fully utilize bandwidth resources to improve the channel capacity. FIG. 1 shows a current typical carrier modulation principle. The real part of a baseband complex signal is multiplied by the carrier cos(ωt), and the imaginary part of the baseband complex signal is multiplied by the carrier sin(ωt), then the multiplied real part and the multiplied imaginary part are accumulated and transmitted finally. This process can be expressed by the following formula: $S_{BP}(t)=\text{Re}\{S_{LP}(t)e^{i\omega t}\}$, where $S_{BP}(t)$ is the carrier modulation signal, $e^{i\omega t}$ is the complex carrier signal, $S_{LP}(t)$ is the baseband complex signal and Re represents taking the real part. The principle of this formula is the multiplication of time domain signals equals to the convolution of frequency domain signals. Baseband signals are shifted to carrier frequency bands via the convolution of carrier frequency signals and the baseband signals. Obviously, in the current carrier modulation methods, although the baseband signal is a complex number and the carrier signal is also a complex number, only the real part taken from the carrier modulation signals is transmitted finally. Therefore, real signals are transmitted, which is called real carrier modulation herein.

Actually, the current real carrier modulation methods have resulted in the multiplied waste of frequency spectrum resources and multiplied loss of signal energy as negative frequencies are not proper understood and used.

Firstly, negative frequencies do exist. As shown in FIG. 2, an angle of counterclockwise rotation is defined as +θ, and an angle of clockwise rotation is defined as −θ, then it can be learned based on the definition $$\omega = \frac{d\theta}{dt}$$

of an angular frequency that a negative angular frequency $$-\omega = \frac{d(-\theta)}{dt}$$

is generated by "negative angle" instead of "negative time". Therefore, as a matter of fact, the positive and negative frequencies only represent that there are rotations in two different directions on a plane. In essence, the positive and negative rotations exist because the plane has two surfaces. The positive frequencies whose rotation directions accord with the right-hand rule are defined as right rotation frequencies herein, which are called right frequencies for short. The negative frequencies whose rotation directions accord with the left-hand rule are defined as left rotation frequencies herein, which are called left frequencies for short. Unless otherwise referred to, the positive and negative frequencies, the positive and negative frequency bands, and the positive and negative spectrums etc. in the existing technologies are replaced by terms such as left and right frequencies, left and right frequency bands, and left and right spectrums etc. hereinafter.

So far, no matter in teaching materials or in engineering implementation, the defined available bandwidths (also known as operating frequency bands) are within the range of right spectrums with positive signs, while left spectrums are abandoned selectively because of the negative signs in the mathematical expressions. FIG. 3 shows division of frequency bands in the most cutting-edge Long Term Evolution (LTE) communication protocol currently, and frequency spectrum resources with negative signs are completely neglected.

While understanding the natural existence of left frequencies, how to distinguish the left and right frequencies, or how to describe these two rotations on a plane? Euler's formula will give the answer: $e^{\pm i\omega t}=\cos(\omega t)\pm i\sin(\omega t)$. As shown in FIG. 4, $e^{-i\omega t}$ and $e^{i\omega t}$ represent a clockwise rotation curve and a counterclockwise rotation curve respectively, corresponding to the left and right frequency signals. Although the left and right frequency signals are easily distinguished in a "time-complex number" space, the projections of the left and right frequency signals are all real signals cos(ωt) apparently on a "time-real part" plane, i.e. $\text{Re}\{e^{-i\omega t}\}=\text{Re}\{e^{+i\omega t}\}=\cos(\omega t)$. Therefore, when a real signal appears, it cannot be distinguished whether the signal is the projection of a left frequency signal or the projection of a right frequency signal; speaking from the probability, the signal is equally likely to be a left frequency signal or a right frequency signal, i.e. both the probability of being a left frequency signal and the probability of being a right frequency signal are ½, i.e. $\cos(\omega t)=(e^{-i\omega t}+e^{i\omega t})/2$. Therefore, real signals with only one degree of freedom are incomplete. A complex signal with at least two degrees of freedom is required to describe a frequency signal unambiguously. In order words, complete description of a frequency signal must be in a form of a complex number. In the complete description, the left and right frequencies $e^{-i\omega t}$ and $e^{i\omega t}$ in the form of the complex number are two completely independent frequencies which can be distinguished. Therefore, the left and right frequencies are able to carry completely independent information.

As analyzed above, real signals generated by real carrier modulation actually cause confusion of left and right frequencies, thus the left and right frequency bands are both occupied, and information on the left and right frequency bands are in conjugate symmetry and not independent. FIG. 5 shows a spectrum shifting in real carrier modulation, wherein the abscissa is the frequency ω, the ordinate is the amplitude F(ω) and $\omega_C$ is the carrier frequency. By the way, in the real carrier modulation mode, since two-dimensional complex signals are observed from incomplete one-dimensional real signals, the left frequency band generated by the real carrier modulation mode has brought great confusion, and may be mistakenly assumed to be only a mirror image which does not really exist in case of not knowing the meaning and function of the left frequency band. A more serious point of view regards signals of the left frequency band harmful, thus bringing about many methods such as "mirror image inhibition" etc.

Currently, the received signals are regarded as real signals during demodulation, therefore multiplication, i.e. frequency band shifting is performed for real signals only. Generally, the right frequency band is shifted to a baseband. In this way, the left frequency band is shifted to a position, the distance from the position to the baseband is twice the distance from the left frequency band to the baseband before shifting, and all information of the left frequency band filtered by the baseband is erased. Although the mirror image information of the left frequency band is redundant, energy loss of the signal will be multiplied actually if the mirror image information of the left frequency band is abandoned directly. FIG. 6 shows a spectrum shifting in real carrier demodulation, wherein the abscissa is the frequency $\omega$, the ordinate is the amplitude $F(\omega)$ and $\omega_C$ is the carrier frequency. FIG. 7 shows energy loss in a process from transmitting signals to receiving the signals. A complete complex signal is a left-rotation or right-rotation plane signal (a). Having undergone the grating effect (b) of real carrier modulation, and the projection effect (c) of a receiving antenna, the energy loss of the actually received signal may be quadrupled or more. Luckily, such incomplete real carrier demodulation is applied because the information carried in the left and right frequencies is conjugate mirror information, thus it is the same to receive the information on the left frequency even if a demodulation terminal is confused with the left and right frequencies; in this case, it only needs to exchange the I data and Q data to mirror the information back, that's why many instruments are provided with an option for performing I, Q exchange for received signals.

It can be seen from the frequency band shifting process in the modulation and demodulation above that the frequency is actually a relative value which changes with the change of a reference frequency. The reference frequency here refers to a modulation and demodulation frequency and only the distance between the frequencies, i.e. the frequency band has an absolute meaning, which proves the actual existence of "negative frequencies" from another perspective.

To sum up, because of the natural bias to the left frequency, all bandwidth definitions included in all current communication systems including wireless, wire, optical fiber, radar and the like, neglect the frequency spectrum resources of the left frequency, which leads to a waste of half of the frequency spectrum resources. In addition, the left and right frequency bands are occupied in the current real carrier modulation, and either the left frequency band signal energy or the right frequency band signal energy is abandoned in the current real carrier demodulation.

SUMMARY

To solve the problem above, the disclosure provides a method and device for complex carrier demodulation.

To solve the technical problem above, the disclosure provides a method for complex carrier demodulation, the method includes: demodulating modulated signals using complex signals as carrier signals to obtain complex carrier demodulation signals; wherein, the complex carrier signals are left rotation complex carrier signals $e^{-i\omega t}$ or right rotation complex carrier signals $e^{i\omega t}$.

Further, the modulated signals may be complex signals including real part signals and imaginary part signals.

Further, when demodulating modulated signals using complex signals as carrier signals, the following formula may be applied:

$$S_{RLP}(t)=S_{BP}(t)e^{-i\omega t}=(S_{LP}(t)e^{i\omega t})e^{-i\omega t}=S_{LP}(t),$$

wherein $S_{RLP}(t)$ represents complex carrier demodulation signals, $S_{BP}(t)$ represents complex carrier modulation signals, $S_{LP}(t)$ represents signals to be carried, $e^{i\omega t}$ represents right rotation complex carrier signals, and $e^{-i\omega t}$ represents left rotation complex carrier signals.

Further, a rotation direction of the left rotation complex carrier signals may accord with the left-hand rule, and a rotation direction of the right rotation complex carrier signals may accord with the right-hand rule.

Further, when demodulating modulated signals using complex signals as carrier signals, the following formula may be applied: $S_{RLP}(t)=S_{BP}(t)e^{i\omega t}=(S_{LP}(t)e^{-i\omega t})e^{i\omega t}=S_{LP}(t),$ wherein $S_{RLP}(t)$ represents complex carrier demodulation signals, $S_{BP}(t)$ represents complex carrier modulation signals, $S_{LP}(t)$ represents signals to be carried, $e^{-i\omega t}$ represents left rotation complex carrier signals, and $e^{i\omega t}$ represents right rotation complex carrier signals.

Further, a rotation direction of the left rotation complex carrier signals may accord with the left-hand rule, and a rotation direction of the right rotation complex carrier signals may accord with the right-hand rule.

To solve the technical problem above, the disclosure provides a device for complex carriers demodulation, which is configured to demodulate modulated signals using complex signals as carrier signals to obtain complex carrier demodulation signals; the complex carrier signals are left rotation complex carrier signals $e^{-i\omega t}$ or right rotation complex carrier signals $e^{i\omega t}$.

Firstly, compared with real carrier modulation, complex carrier modulation applies complex signals $e^{\pm i\omega t}$ which describes frequency signals completely as carrier signals, to modulate signals to be carried, thus the left and right frequency bands are able to carry information independently, to fully use the frequency spectrum resources; secondly, since the transmitted signals in the complex carrier modulation are rotated complex signals, the signal strength, i.e. the modulus of a complex number is a fixed value, thus avoiding loss of signal energy; finally, compared with real carrier demodulation, complex carrier demodulation applies complex signals $e^{\pm i\omega t}$ which describes frequency signals completely as carrier signals to demodulate modulated signals, which is able to demodulate the information on the left and right frequency bands independently. Therefore, the spectrum utilization ratio using the method for complex carrier modulation/demodulation of the disclosure doubles the spectrum utilization ratio using the method for real carrier modulation/demodulation, and the signal energy can be maintained well.

To sum up, the disclosure provides a method for complex carrier modulation/demodulation, which is able to use the right and left frequency spectrum resources adequately, and the loss of signal energy is little, therefore the capacity of the channel is improved greatly.

BRIEF DESCRIPTION OF THE DRAWINGS

The accompanying drawings illustrated here provide further understanding to the disclosure and constitute a part of the application. The exemplary embodiments of the disclosure and the illustrations thereof are used for explaining the disclosure, instead of constituting an improper limitation to the disclosure. In the accompanying drawings:

FIG. 3 shows division of bandwidths in the LTE communication protocol;

DETAILED DESCRIPTION

The disclosure will be described in detail below with reference to the accompanying drawings and in combination with the embodiments. It should be noted that, if there is no conflict, the embodiments of the application and the characteristics in the embodiments can be combined with one another.

The disclosure is based on the following principle: a frequency signal is described completely in a form of a complex number, i.e. $e^{-i\omega t}$ and $e^{i\omega t}$. When frequency signal is described completely, $e^{-i\omega t}$ and $e^{i\omega t}$ are two distinguishable frequencies, and therefore can carry independent information. According to the principle, the disclosure uses $e^{-i\omega t}$ or $e^{i\omega t}$ as carrier signals, and $e^{-i\omega t}$ is called left rotation carrier signals and $e^{i\omega t}$ is called right rotation complex carrier signals.

A method for complex carrier modulation includes: modulating signals to be carried using complex signals as carrier signals to obtain complex carrier modulation signals. The complex carrier signals are $e^{-i\omega t}$ or $e^{i\omega t}$.

Figure 8:
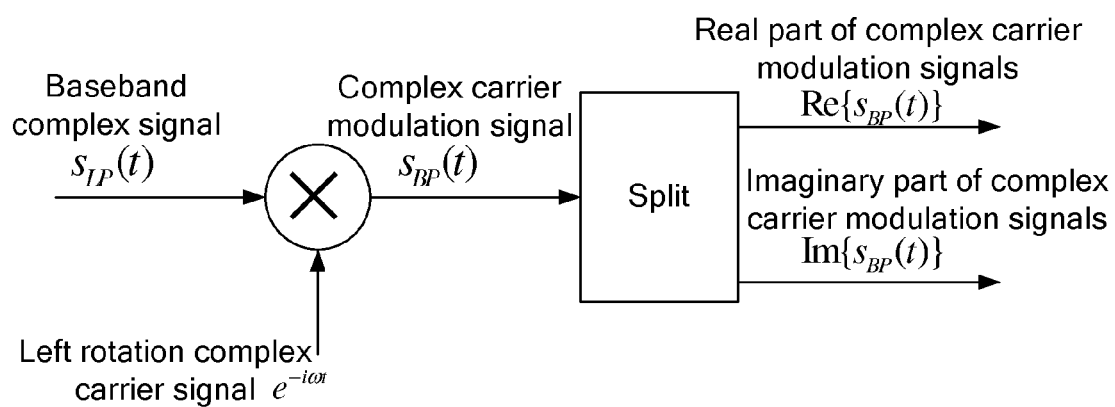
FIG. 8 shows a principle of left rotation complex carrier modulation.
Figure 9:
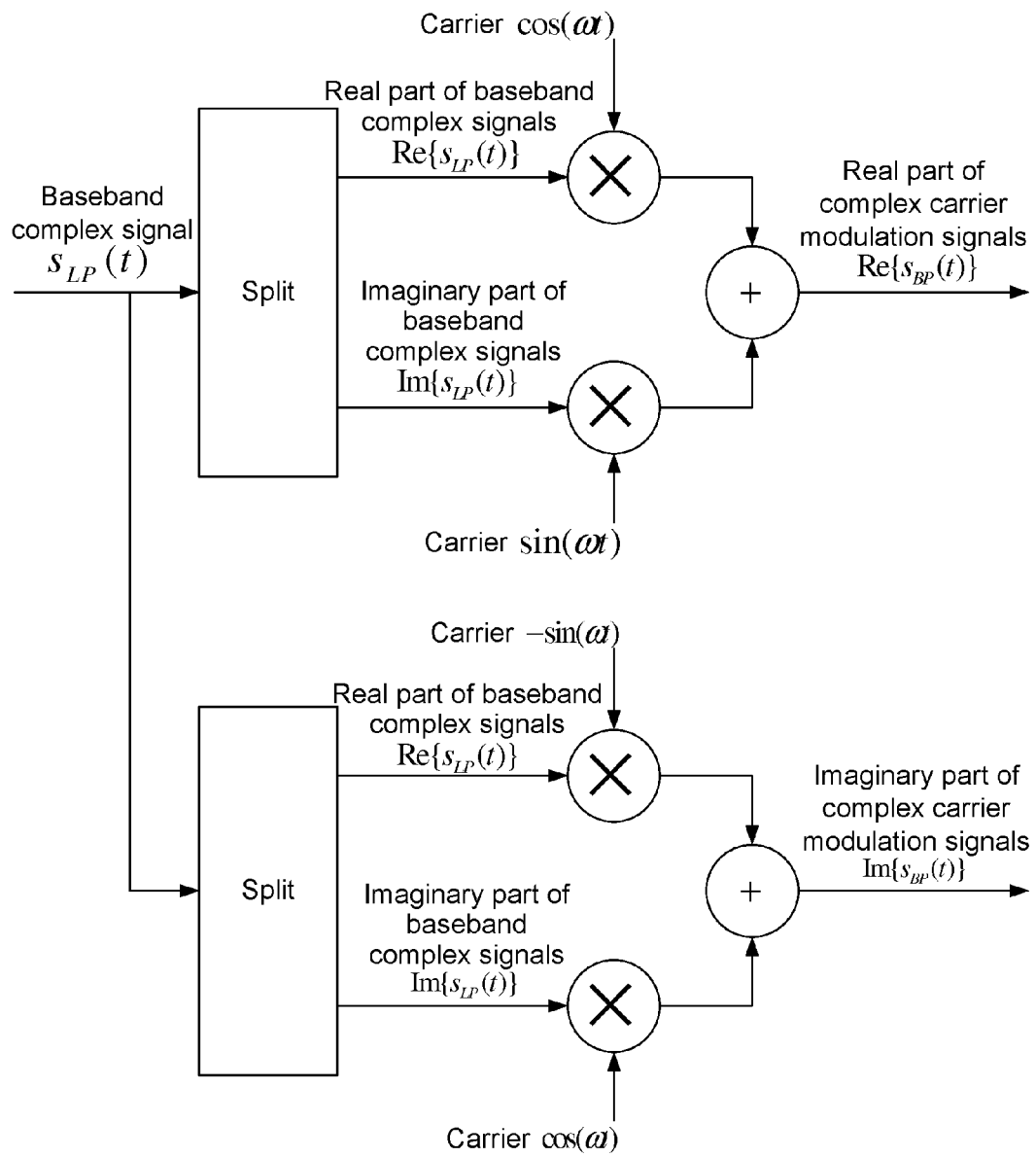
FIG. 9 shows a structural diagram of left rotation complex carrier modulation.
Figure 10:
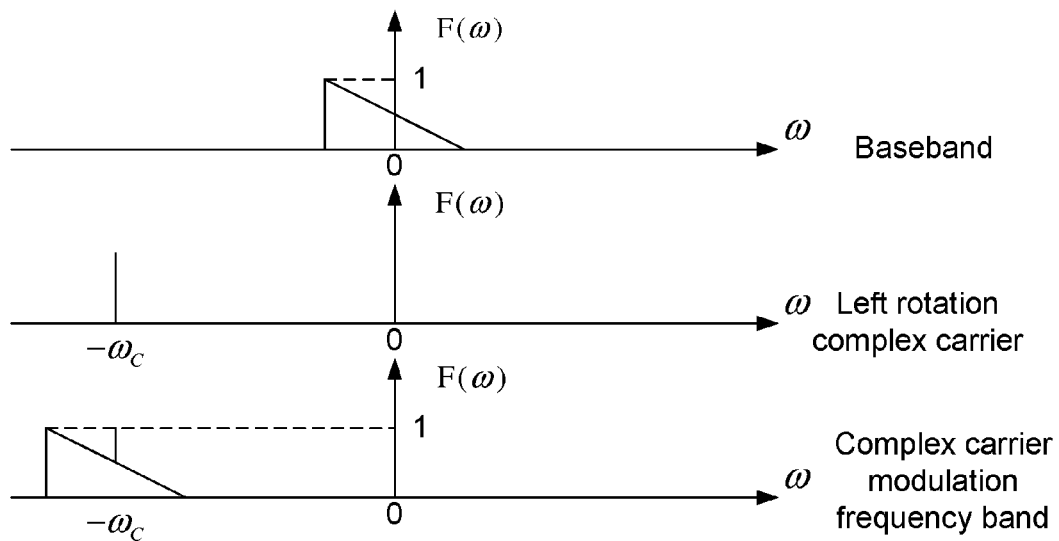
FIG. 10 shows a spectrum shifting process in left rotation complex carrier modulation.

Modulation is performed using left rotation complex carrier signals according to the following formula: $S_{BP}(t)=S_{LP}(t)e^{-i\omega t}$, wherein $S_{BP}(t)$ represents the complex carrier modulation signals, $S_{LP}(t)$ represents the baseband complex signals, and $e^{-i\omega t}$ represents the left rotation complex carrier signals. FIG. 8, FIG. 9 and FIG. 10 show the principle, structure and process of left rotation complex carrier modulation, respectively.

As shown in FIG. 8, the real parts and the imaginary parts of the left rotation complex carrier modulation signals are both transmitted in a transmission medium, therefore the left rotated complex signals are transmitted in the medium.

As shown in FIG. 9, the left rotation complex carrier modulation process actually refers to modulating the real part signals and the imaginary part signals, respectively.

As shown in FIG. 10, since the left rotated complex signals are the determined left frequency signals, thus the left rotation complex carrier modulation signals occupy the left frequency band only, wherein abscissa is the frequency $\omega$, the ordinate is the amplitude $F(\omega)$, and $\omega_C$ is the complex carrier frequency.

Figure 11:
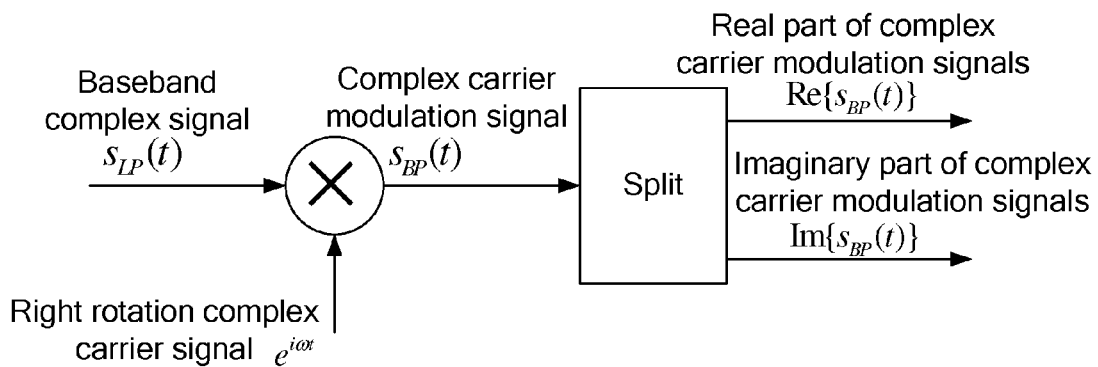
FIG. 11 shows a principle of right rotation complex carrier modulation.
Figure 12:
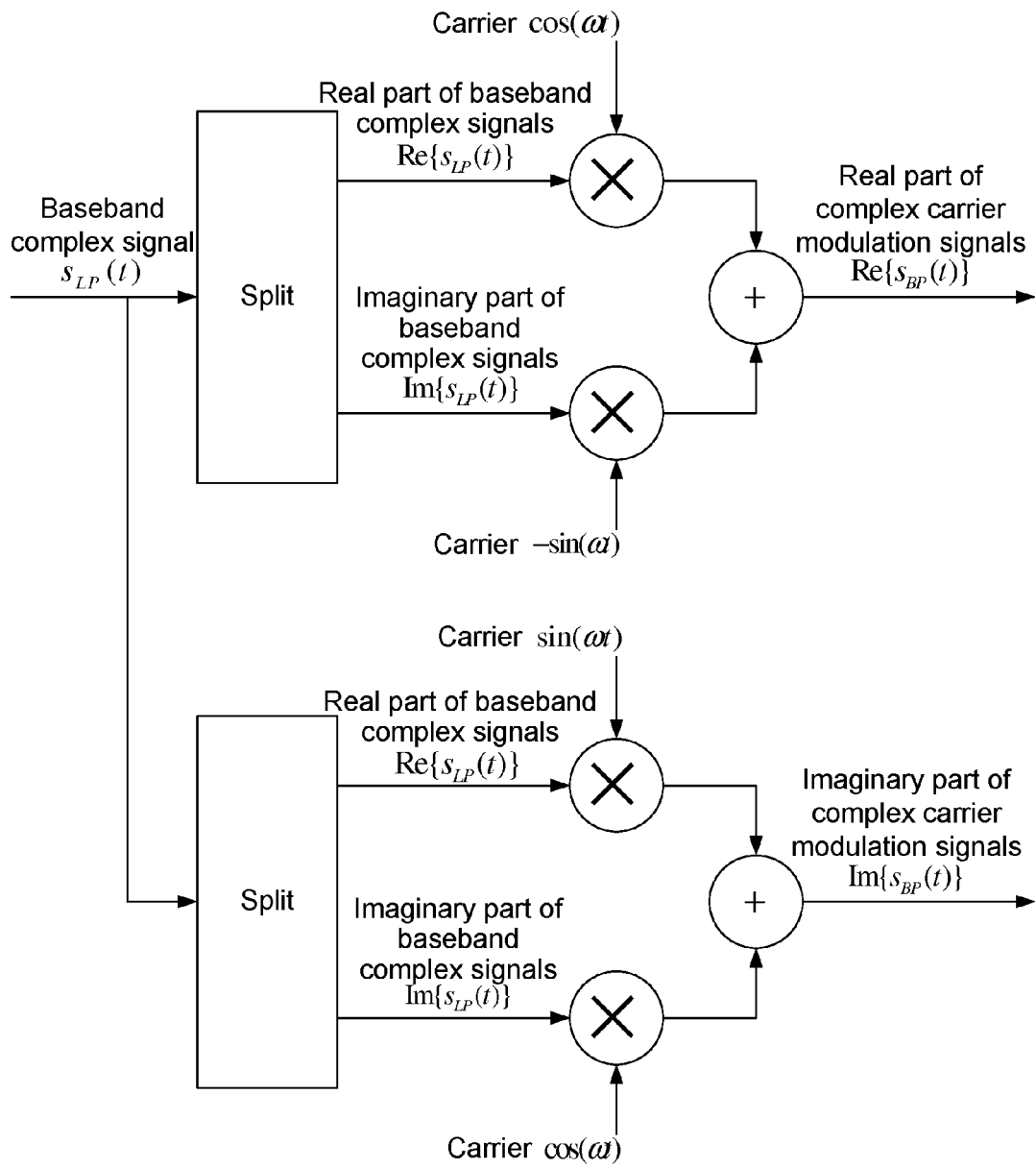
FIG. 12 shows a structural diagram of right rotation complex carrier modulation.
Figure 13:
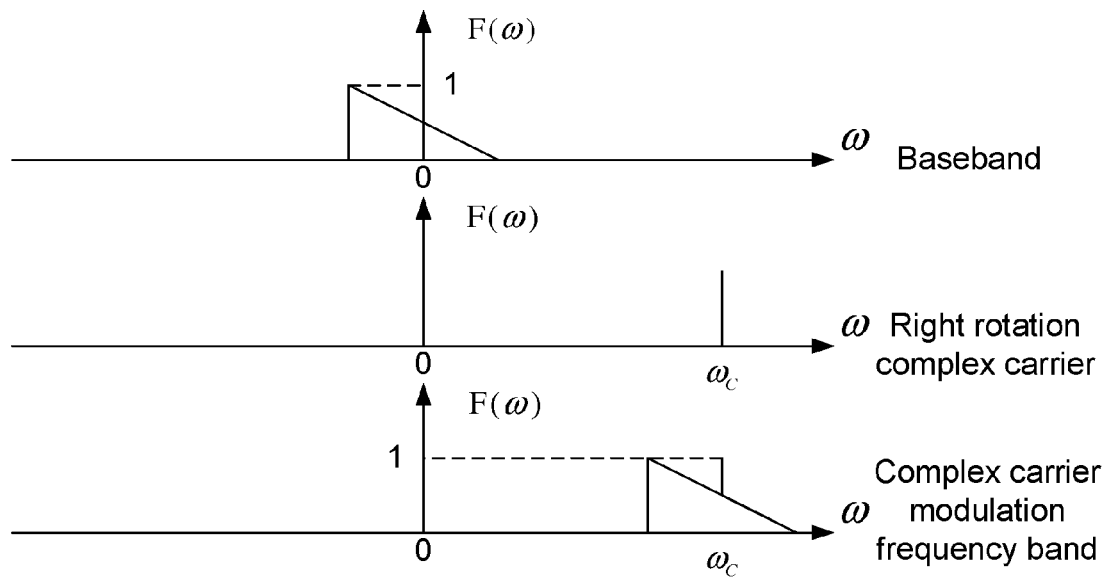
FIG. 13 shows a spectrum shifting process in right rotation complex carrier modulation.

Modulation is performed using right rotation complex carrier signals according to the following formula: $S_{BP}(t)=S_{LP}(t)e^{i\omega t}$, wherein $S_{BP}(t)$ represents the complex carrier modulation signals, $S_{LP}(t)$ represents the baseband complex signals, and $e^{i\omega t}$ represents the right rotation complex carrier signals. FIG. 11, FIG. 12 and FIG. 13 show the principle, structure and process of right rotation complex carrier modulation, respectively.

As shown in FIG. 11, the real parts and the imaginary parts of the right rotation complex carrier modulation signals are both transmitted in a transmission medium, therefore the right rotated complex signals are transmitted in the medium.

As shown in FIG. 12, the right rotation complex carrier modulation process actually refers to modulating the real part signals and the imaginary part signals, respectively.

As shown in FIG. 13, since the right rotated complex signals are the determined right frequency signals, thus the right rotation complex carrier modulation signals occupy the right frequency band only, wherein abscissa is the frequency $\omega$, the ordinate is the amplitude $F(\omega)$, and $\omega_C$ is the complex carrier frequency.

Complex carrier modulation is a process for shifting signals to be carried to a carrier frequency band. Similarly, complex carrier demodulation is a process for shifting the carried signals back from the carrier frequency band. In essence, both the complex carrier modulation and the complex carrier demodulation refer to spectrum shifting, except that the spectrum shifting is performed in opposite directions. Therefore, the left rotation complex carrier modulation signals should be demodulated by the right rotation complex carrier signals. Similarly, the right rotation complex carrier modulation signals should be demodulated by the left rotation complex carrier signals.

Figure 14:
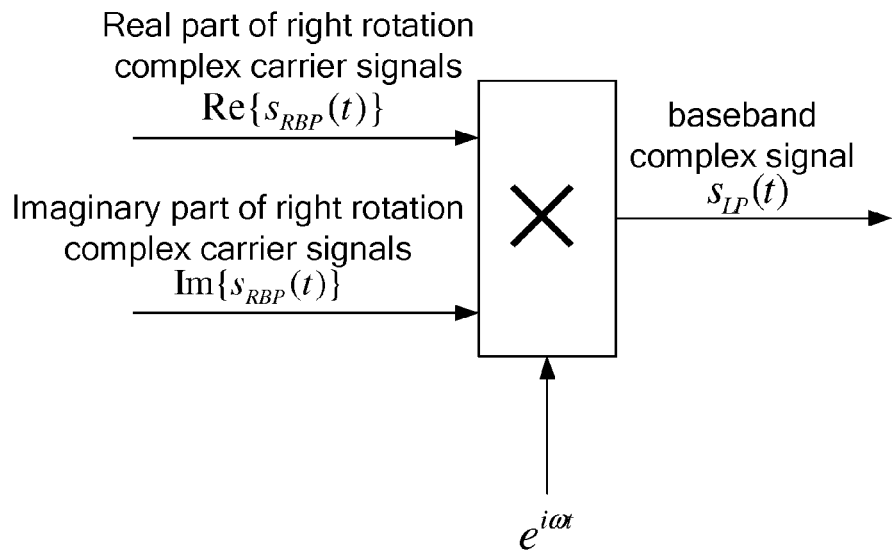
FIG. 14 shows a principle of right rotation complex carrier demodulation.
Figure 15:
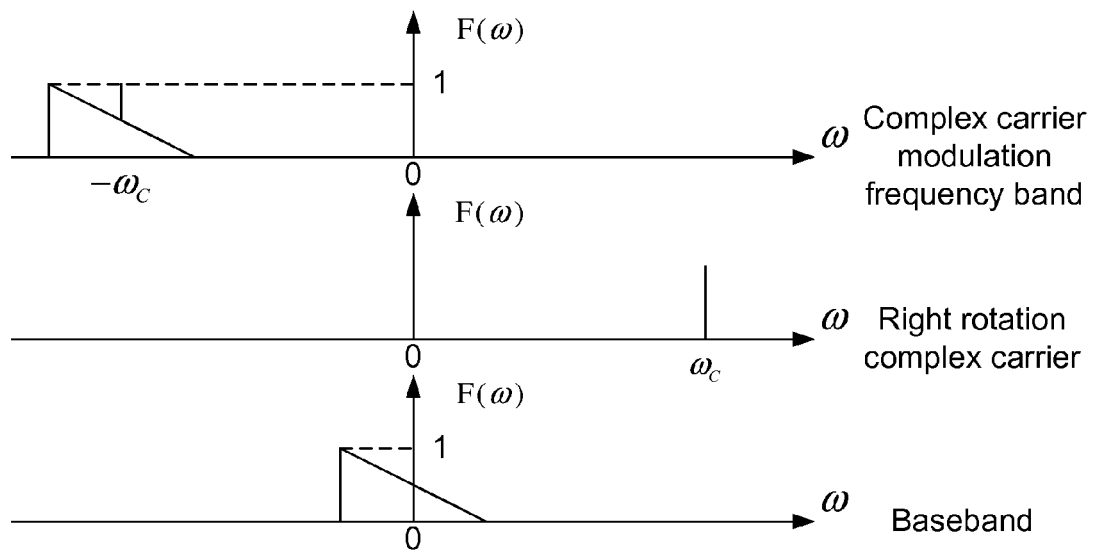
FIG. 15 shows a spectrum shifting process in right rotation complex carrier demodulation.

The left rotation complex carrier modulation signals are demodulated by the right rotation complex carrier signals according to the following formula: $S_{RLP}(t)=S_{BP}(t)e^{i\omega t}=(S_{LP}(t)e^{-i\omega t})e^{i\omega t}=S_{LP}(t)$, wherein $S_{RLP}(t)$ represents the received complex signals, $e^{i\omega t}$ represents the right rotation complex carrier signals, $S_{BP}(t)$ represents the complex carrier modulation signals, i.e. the modulated signals. The demodulation principle and process of right rotation complex carrier modulation signals are shown in FIG. 14 and FIG. 15.

Figure 16:
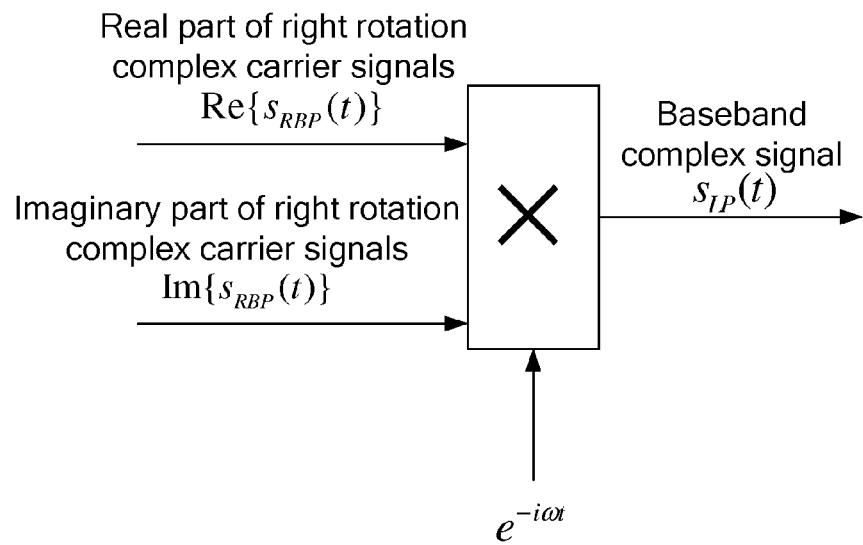
FIG. 16 shows a principle of left rotation complex carrier demodulation.
Figure 17:
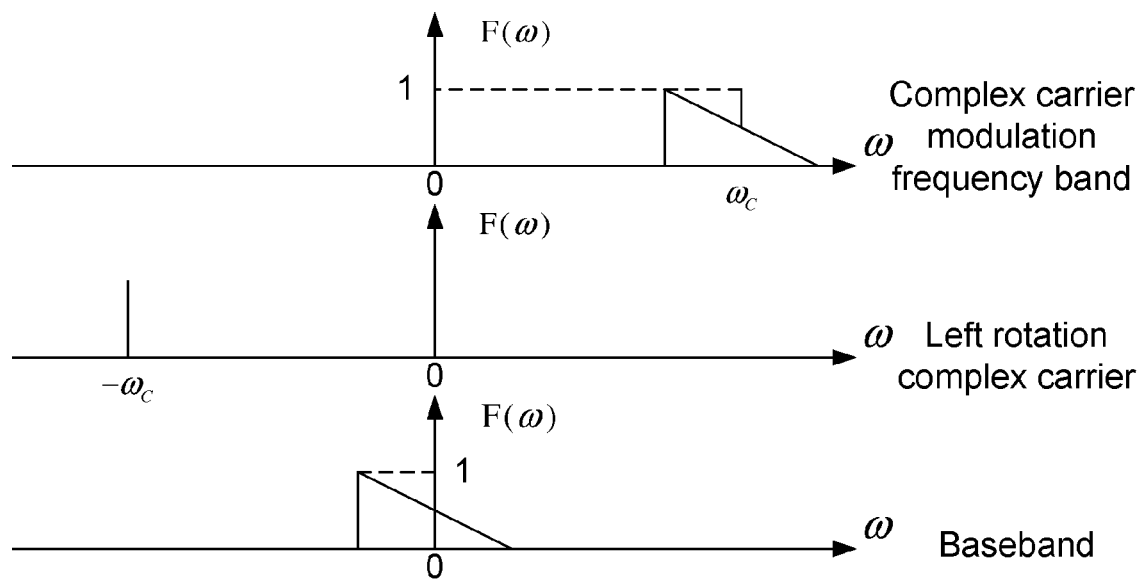
FIG. 17 shows a spectrum shifting process in left rotation complex carrier demodulation.

The right rotation complex carrier modulation signals are demodulated by the left rotation complex carrier signals according to the following formula: $S_{RLP}(t)=S_{BP}(t)e^{-i\omega t}=(S_{LP}(t)e^{i\omega t})e^{-i\omega t}=S_{LP}(t)$, wherein $S_{RLP}(t)$ represents the received complex signals, $e^{-i\omega t}$ represents the left rotation complex carrier signals, $S_{BP}(t)$ represents the complex carrier modulation signals, i.e. the modulated signals. The demodulation principle and process of left rotation complex carrier modulation signals are shown in FIG. 16 and FIG. 17.

Figure 18:
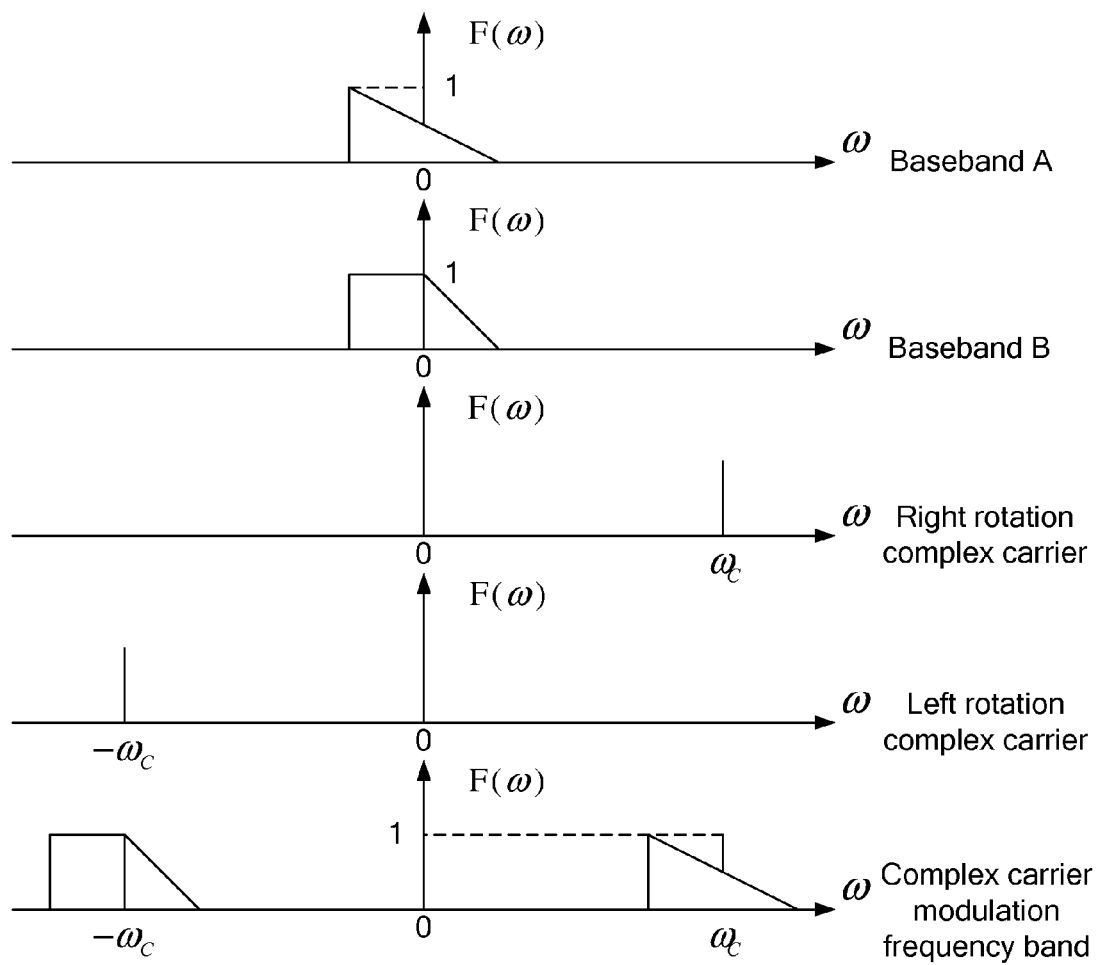
FIG. 18 shows that different information is modulated by left and right rotation complex carriers.
Figure 19:
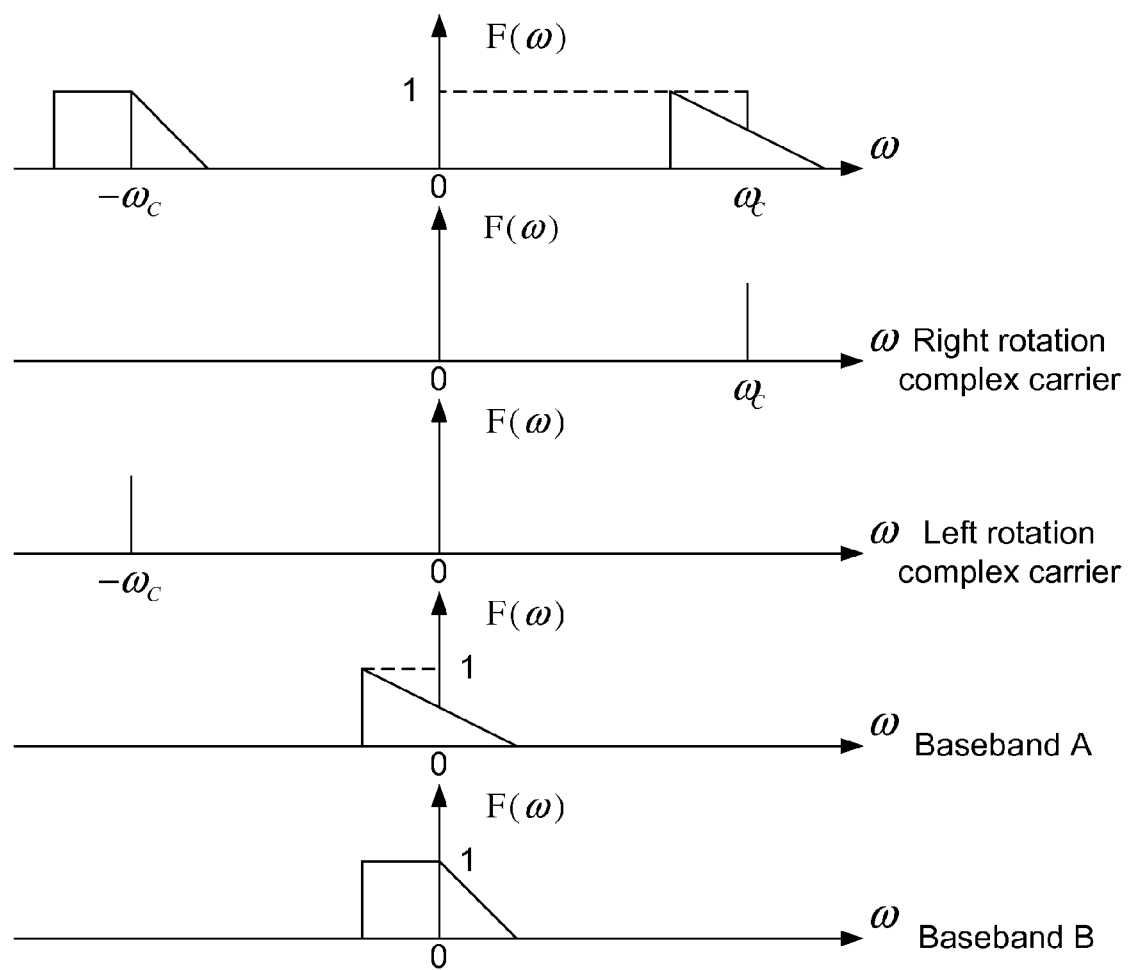
FIG. 19 shows that different information is demodulated by left and right rotation complex carriers.

Since the left and right rotation complex carrier signals are independent signals, therefore they are able to carry different information independently. The process is as shown in FIG. 18, signals A and B to be carried may be carried to the left frequency band and the right frequency band by applying $\omega_C$ and $-\omega_C$ respectively. Similarly, the signals A and B to be carried may be demodulated respectively, which is shown in FIG. 19. By doing so, the same frequency band is occupied, but two kinds of independent signals to be carried can be transmitted compared with the existing technologies.

Figure 20:
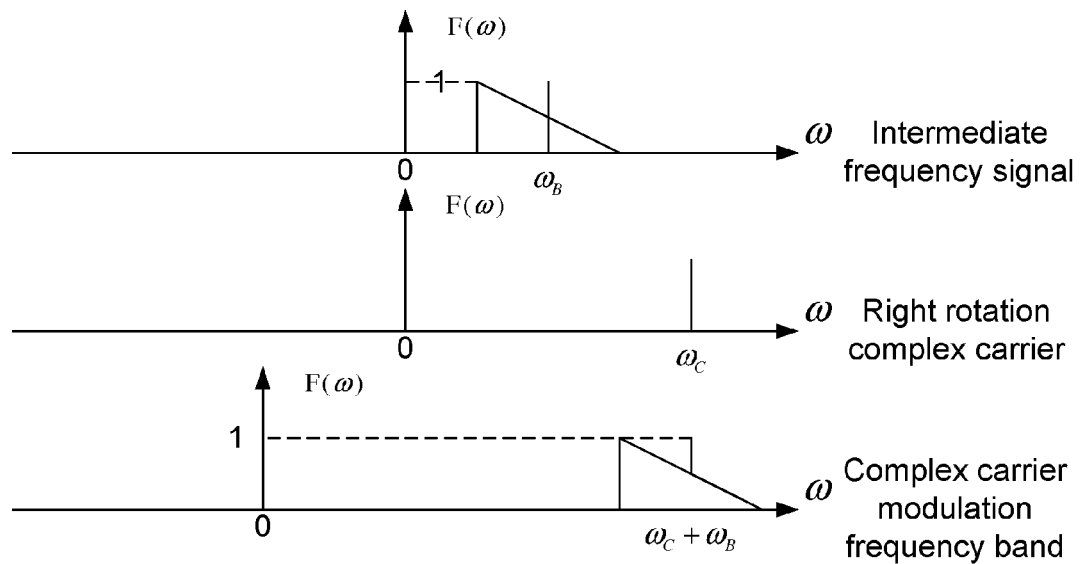
FIG. 20 shows that intermediate frequency information is modulated by right rotation complex carriers.
Figure 21:
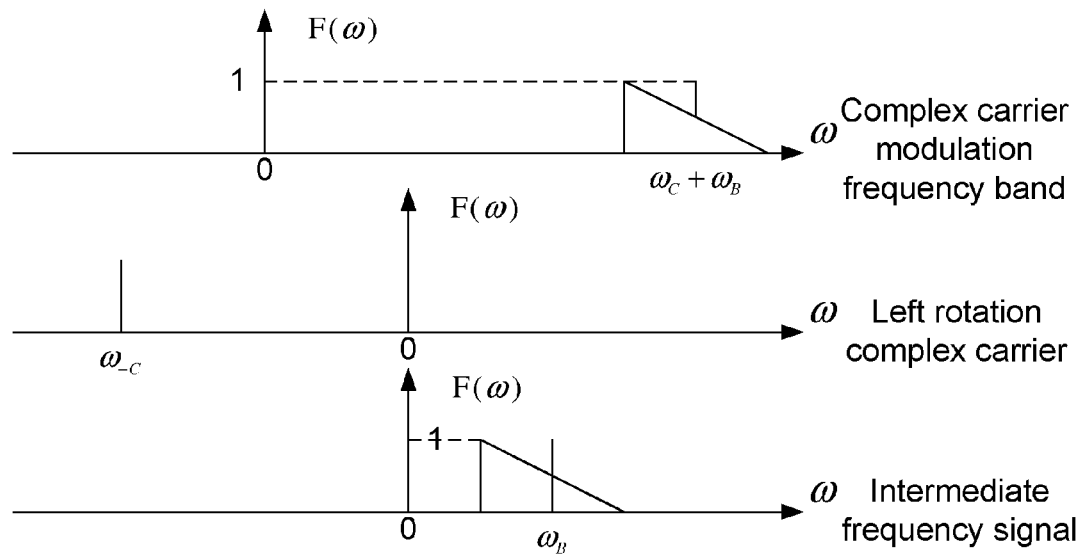
FIG. 21 shows that intermediate frequency information is demodulated by left rotation complex carriers.

The essence of carrier modulation and demodulation is spectrum shifting, therefore the positions of signals to be carried in spectrums are not restricted. The signals to be carried may be baseband signals, or intermediate frequency signals or even modulated signals, signals which have been modulated twice or signals which have been modulated for N times. As shown in FIG. 20 and FIG. 21, the abscissas represent the frequency, the ordinates represent the amplitude, $\omega_C$ is a complex carrier frequency and $\omega_B$ is a complex carrier frequency. Right rotation complex carriers are applied in this embodiment, and left rotation complex carriers are applied to demodulation. The process is a process for modulating complex carriers of intermediate frequency signals.

Figure 22:
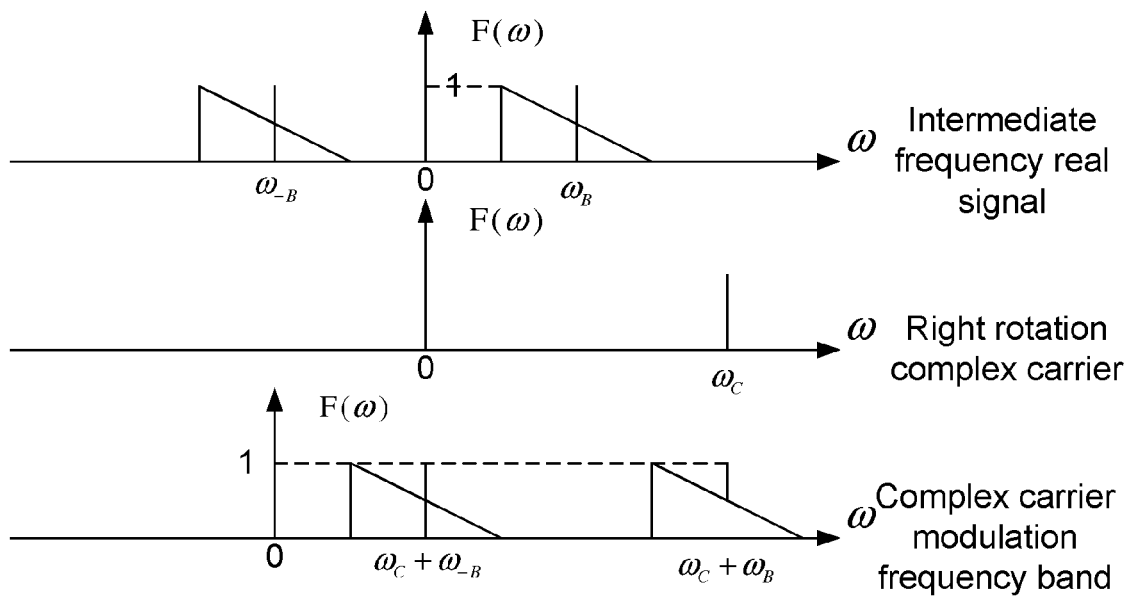
FIG. 22 shows that intermediate frequency real signals are modulated by right rotation complex carriers.

The essence of carrier modulation and demodulation is spectrum shifting, therefore the forms of signals to be carried are not restricted. The signals to be carried may be analog signals, digital signals, complex signals, or real signals. As shown in FIG. 22, the process in this embodiment is a process for modulating complex carriers of intermediate frequency real signals. Here, right rotation complex carriers are applied in the modulation, wherein the abscissa is the frequency, the ordinate is the amplitude, $\omega_C$ is a complex carrier frequency, $\omega_B$ is a carrier frequency and $\omega_{-B}$ is a carrier frequency.

Figure 23:
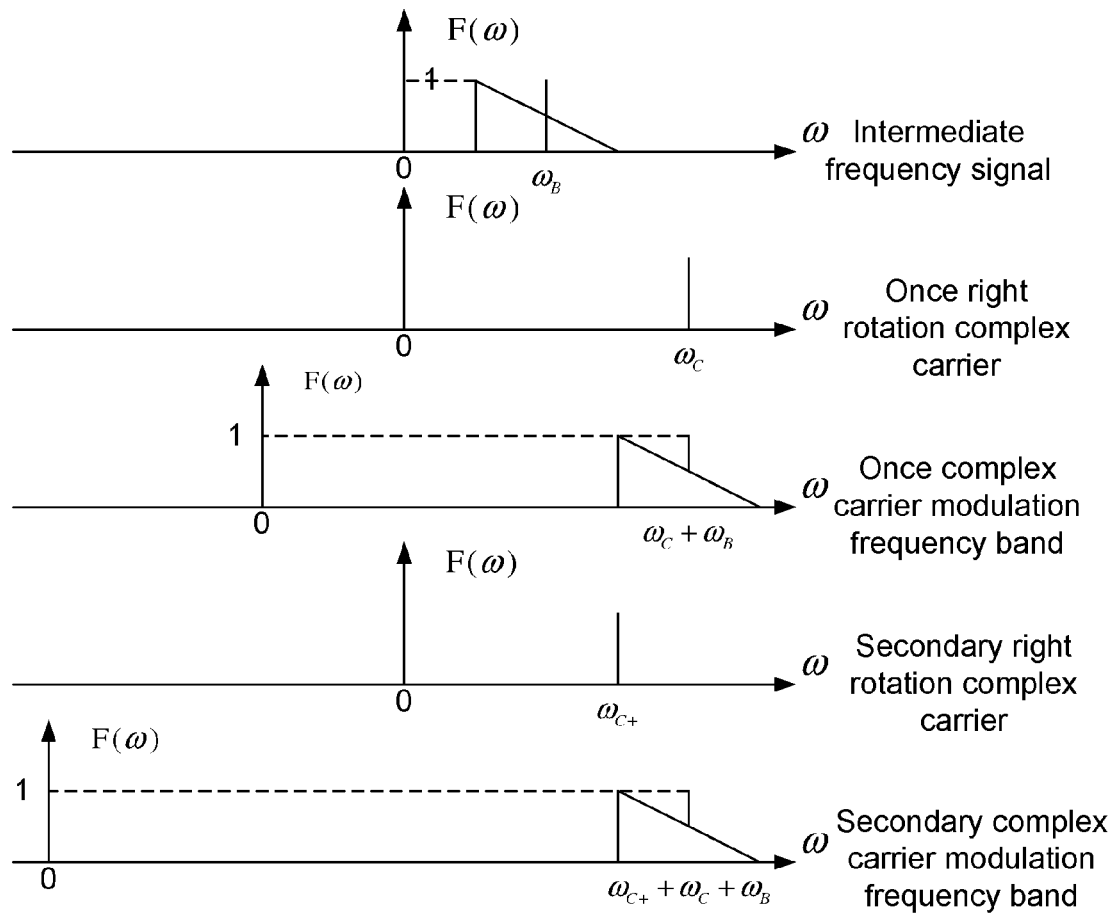
FIG. 23 shows secondary modulation of right rotation complex carriers.

The essence of carrier modulation and demodulation is spectrum shifting, therefore it can be seen that the modulation and demodulation satisfy the "additivity" and the "interchangeability", i.e. complex carrier modulation and demodulation process may be performed for unlimited times. In other words, the modulation may be performed once, twice . . . , for N times, which is equivalent to accumulation of modulations. In addition, the modulation sequences may also be exchanged without influencing the accumulation result according to the following formula: $\omega_C=\omega_{C1}+\omega_{C2}+\omega_{C3}+ \ldots +\omega_{CN}$. FIG. 23 shows a secondary modulation, wherein the abscissa is the frequency, the ordinate is the amplitude, $\omega_B$ is a carrier frequency, $\omega_C$ is a once complex carrier frequency and $\omega_{C+}$ is a secondary complex carrier frequency.

The disclosure provides a device for complex carrier modulation, which is configured to modulate signals to be carried using complex signals as carrier signals to obtain complex carrier modulation signals. The complex carrier signals are $e^{-i\omega t}$ or $e^{i\omega t}$.

The device for complex carrier modulation of the disclosure specifically includes a complex carrier modulation signal real part modulation unit and a complex carrier modulation signal imaginary part modulation unit.

FIG. 9 shows the first embodiment of the device for complex carrier modulation, in this embodiment, the left rotation complex carrier signal is used for modulation; the real part modulation unit includes a first multiplier, a second multiplier and a first accumulator. The first multiplier is configured to multiply the real part of the signals to be carried with cos($\omega$t), the second multiplier is configured to multiply the imaginary part of the signals to be carried with sin($\omega$t), and the first accumulator is configured to perform accumulation of results of the first and second multipliers to obtain the real parts of the complex carrier modulation signals. The imaginary part modulation unit includes a third multiplier, a fourth multiplier and a second accumulator; the third multiplier is configured to multiply the real part of the signals to be carried with −sin($\omega$t), the fourth multiplier is configured to multiply the imaginary part of the signals to be carried with cos($\omega$t), and the second accumulator is configured to perform accumulation of results of the third and fourth multipliers to obtain the complete complex carrier modulation signals.

FIG. 12 shows the second embodiment of the device for complex carrier modulation, in this embodiment, the right rotation complex carrier signal is used for modulation; the real part modulation unit includes a first multiplier, a second multiplier and a first accumulator. The first multiplier is configured to multiply the real part of the signals to be carried with cos($\omega$t), the second multiplier is configured to multiply the imaginary part of the signals to be carried with −sin($\omega$t), and the first accumulator is configured to perform accumulation of results of the first and second multipliers. The imaginary part modulation unit includes a third multiplier, a fourth multiplier and a second accumulator; the third multiplier is configured to multiply the real part of the signals to be carried with sin($\omega$t), the fourth multiplier is configured to multiply the imaginary part of the signals to be carried with cos($\omega$t), and the second accumulator is configured to perform accumulation of results of the third and fourth multipliers to obtain the complete complex carrier modulation signals.

The disclosure further provides a device for complex carrier demodulation, which is configured to demodulate modulated signals using complex signals as carrier signals to obtain complex carrier demodulation signals. The complex carrier signals are $e^{-i\omega t}$ or $e^{i\omega t}$, and the device specifically includes: a complex carrier demodulation signal real part demodulation unit and a complex carrier demodulation signal imaginary part demodulation unit.

Embodiment 1: when the modulation terminal uses left rotation complex carrier for modulation, the demodulation device uses the right rotation complex carrier for demodulation. The real part demodulation unit includes a first multiplier, a second multiplier and a first accumulator. The first multiplier is configured to multiply the real part of the signals to be carried with cos($\omega$t), the second multiplier is configured to multiply the imaginary part of the signals to be carried with −sin($\omega$t), and the first accumulator is configured to perform accumulation of results of the first and second multipliers. The imaginary part demodulation unit includes a third multiplier, a fourth multiplier and a second accumulator; the third multiplier is configured to multiply the real part of the signals to be carried with sin($\omega$t), the fourth multiplier is configured to multiply the imaginary part of the signals to be carried with cos($\omega$t), and the second accumulator is configured to perform accumulation of results of the third and fourth multipliers. The specific schematic diagram similar to FIG. 9 and an accompanying drawing will not be repeated here.

Embodiment 2: when the modulation terminal uses right rotation complex carrier for modulation, the demodulation device uses the left rotation complex carrier for demodulation. The real part demodulation unit includes a first multiplier, a second multiplier and a first accumulator. The first multiplier is configured to multiply the real part of the signals to be carried with cos($\omega$t), second multiplier is configured to multiply the imaginary part of the signals to be carried with sin($\omega$t), and the first accumulator is configured to perform accumulation of results of the first and second multipliers. The imaginary part demodulation unit includes a third multiplier, a fourth multiplier and a second accumulator; the third multiplier is configured to multiply the real part of the signals to be carried with −sin($\omega$t), the fourth multiplier is configured to multiply the imaginary part of the signals to be carried with cos(ωt), and the second accumulator is configured to perform accumulation of results of the third and fourth multipliers. The specific schematic diagram is similar to FIG. 12 and an accompanying drawing will not be repeated here.

The disclosure further provides a system for complex carrier modulation/demodulation. When the modulation terminal of the system is a device for complex carrier modulation, the demodulation terminal of the system may be a device for complex carrier modulation or real carrier modulation; when the modulation terminal of the system is a device for real carrier modulation, the demodulation terminal of the system may be a device for complex carrier modulation or real carrier modulation.

The first embodiment of a system for complex carrier modulation/demodulation includes a device for complex carrier modulation and a device for complex carrier demodulation, wherein the device for complex carrier modulation is configured to modulate signals to be carried using complex signals as carrier signals to obtain complex carrier modulation signals. The complex carrier signals are $e^{-i\omega t}$ or $e^{i\omega t}$;

the device for complex carrier demodulation is configured to demodulate modulated signals using complex signals as carrier signals to obtain complex carrier demodulation signals. The complex carrier signals are $e^{-i\omega t}$ or $e^{i\omega t}$.

The second embodiment of a system for complex carrier modulation/demodulation includes a device for complex carrier modulation and a device for real carrier demodulation, wherein the device for complex carrier modulation is configured to modulate signals to be carried using complex signals as carrier signals to obtain complex carrier modulation signals. The complex carrier signals are $e^{-i\omega t}$ or $e^{i\omega t}$.

The third embodiment a system for complex carrier modulation/demodulation includes a device for real carrier modulation and a device for complex carrier demodulation, wherein the device for complex carrier demodulation is configured to demodulate modulated signals using complex signals as carrier signals to obtain complex carrier demodulation signals. The complex carrier signals are $e^{-i\omega t}$ or $e^{i\omega t}$.

The disclosure further provides a device for transmitting complex carrier modulation signals, which is configured to transmit complex carrier modulation signals modulated according to the method for complex carrier modulation above.

The first embodiment of a device for transmitting complex carrier modulation signals includes: a real part signal transmitting unit and an imaginary part signal transmitting unit, wherein the real part signal transmitting unit is configured to transmit real part signals in the complex carrier modulation signals, and the imaginary part signal transmitting unit is configured to transmit imaginary part signals in the complex carrier modulation signals.

Preferably, the real part signal transmitting unit and the imaginary part signal transmitting unit are linearly polarized antennae vertical to each other in a space; or, the real part signal transmitting unit and the imaginary part signal transmitting unit form a circularly polarized antenna.

The disclosure further provides a device for receiving complex carrier modulation signals, which is configured to receive the transmitted complex carrier modulation signals modulated according to the method for complex carrier modulation above.

The first embodiment of a device for receiving complex carrier modulation signals includes: a real part signal receiving unit and an imaginary part signal receiving unit. Wherein the real part signal receiving unit is configured to receive real part signals in the complex carrier modulation signals; and the imaginary part signal receiving unit is configured to receive imaginary part signals in the complex carrier modulation signals, and the real part signals and the imaginary part signals are spatially vertical.

Preferably, the real part signal receiving unit and the imaginary part signal receiving unit are linearly polarized antennae vertical to each other in a space; or the real part signal receiving unit and the imaginary part signal receiving unit form a circularly polarized antenna.

Figure 1:
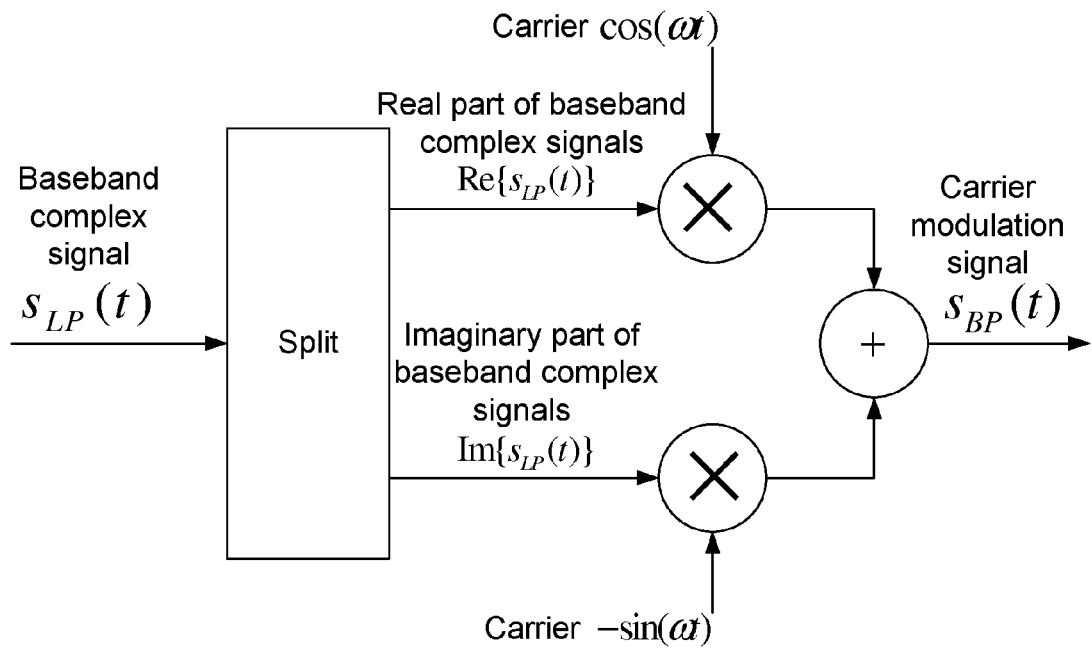
FIG. 1 shows a modulation principle in an existing technology.
Figure 2:
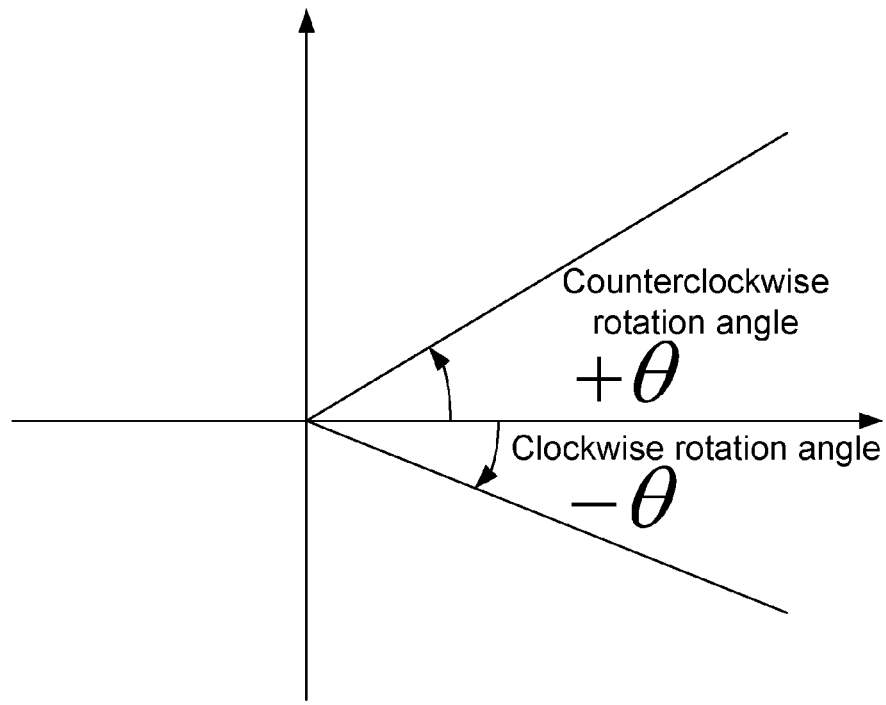
FIG. 2 shows definitions of angles in a complex plane.
Figure 4:
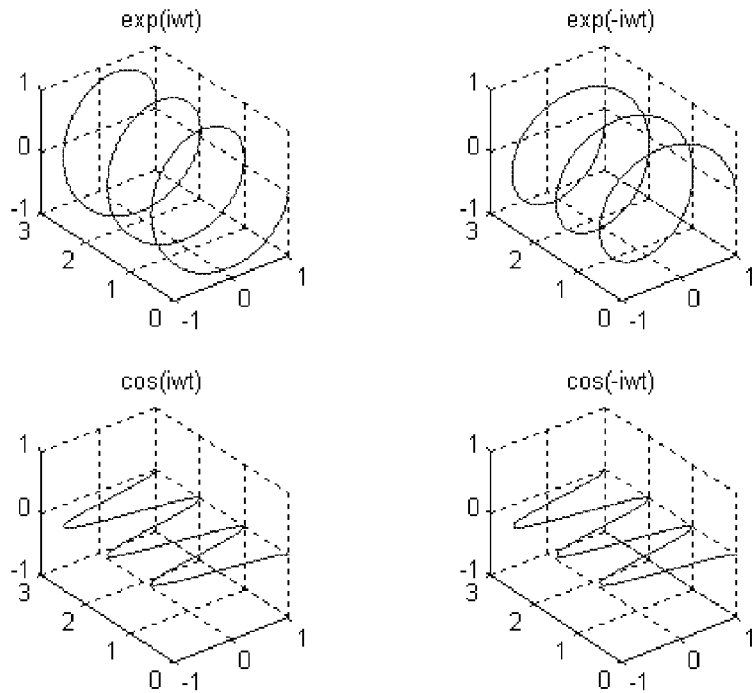
FIG. 4 shows two kinds of rotation $e^{-i\omega t}$ and $e^{i\omega t}$ in a space.
Figure 5:
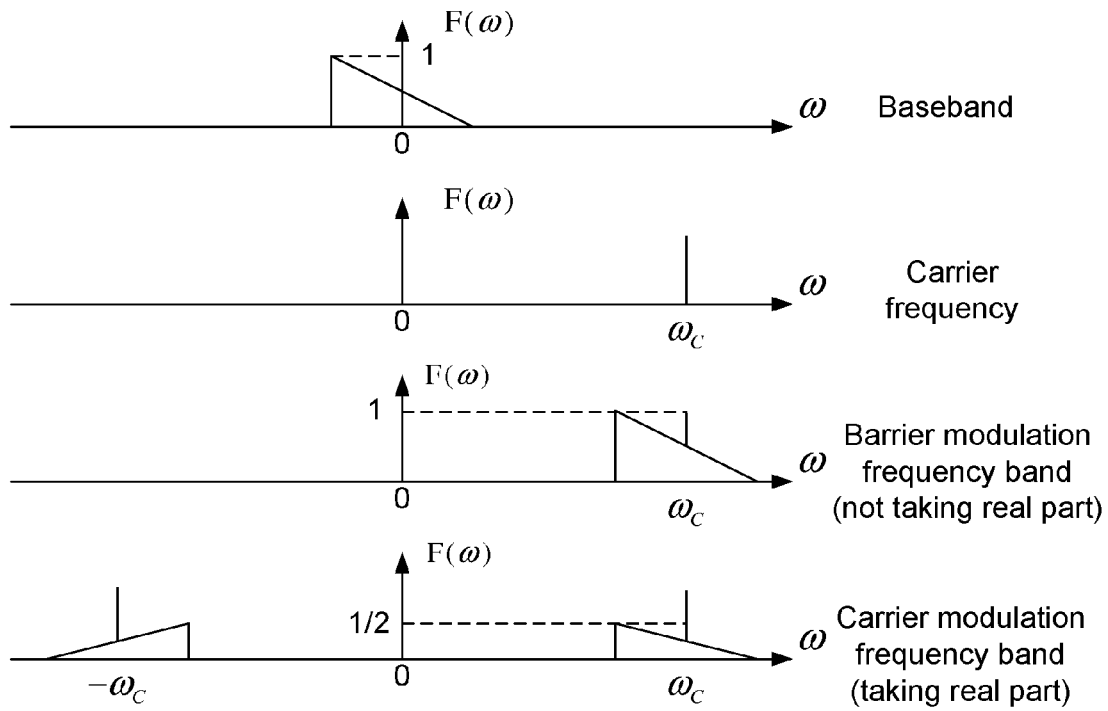
FIG. 5 shows a spectrum shifting process in real carrier modulation.
Figure 6:
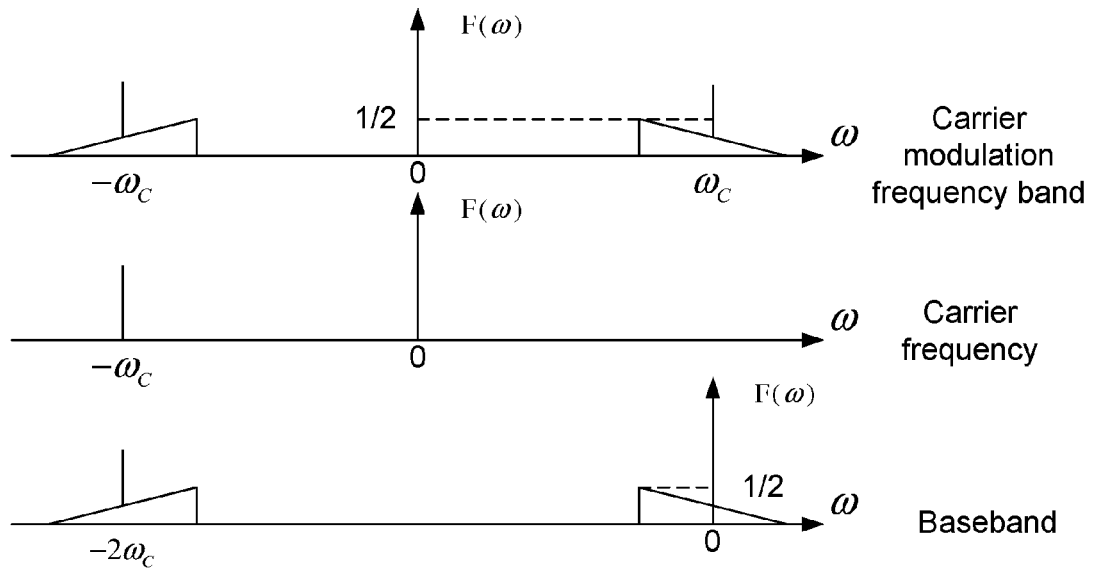
FIG. 6 shows a spectrum shifting process in real carrier demodulation
Figure 7:
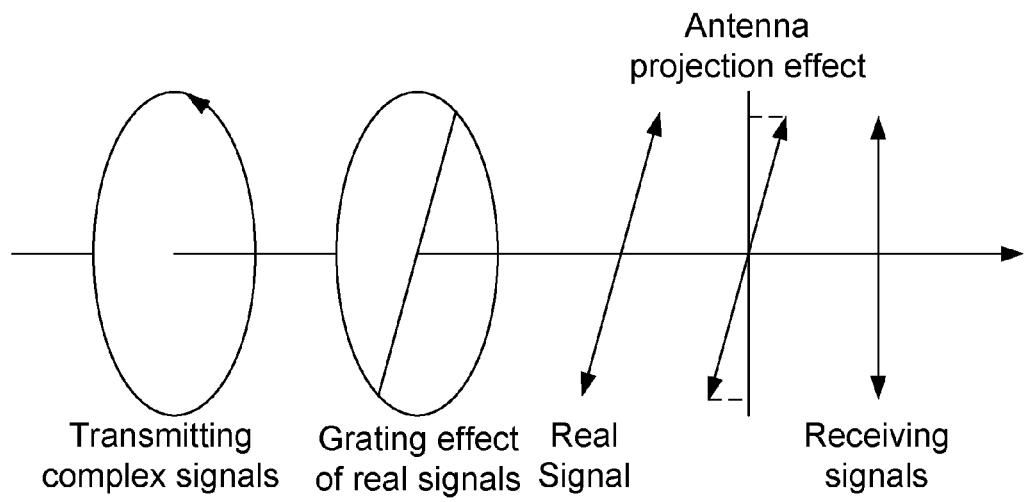
FIG. 7 shows a schematic diagram illustrating energy loss of real carrier signals.
Figure 24:
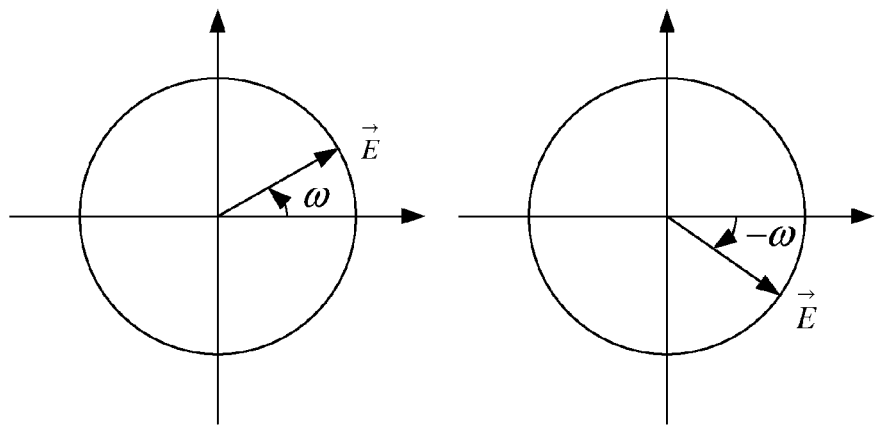
FIG. 24 shows electromagnetic waves in two rotation directions.

Rotated complex signals in a transmission medium are as shown in FIG. 4. It can be seen according to Euler's formula: $e^{\pm i\omega t} = \cos(\omega t) \pm i \sin(\omega t)$ and FIG. 4 that the physical meaning of i is to be spatially vertical. Therefore, as long as real part signals and imaginary part signals which are spatially vertical to each other can be transmitted in a transmission medium, rotated complex signals are formed naturally according to the principle of vector superposition of signals in electric fields. The rotated complex signals are rotated electromagnetic signals. The electromagnetic signals in two rotation directions as shown in FIG. 24 correspond to the left and right rotation complex carrier modulation signals, respectively, wherein the abscissa is the amplitude, the ordinate is the amplitude, ω is the positive angular frequency, -ω is the negative angular frequency and $\vec{E}$ is the electromagnetic vector.

To sum up, with the method for complex carrier modulation/demodulation, the right and left frequency spectrum resources can be used adequately and double frequency spectrum resources can be obtained in the current defined bandwidths, therefore the spectrums are utilized more efficiently compared with real carrier modulation. Besides, since rotated complex signals are transmitted in the medium in the complex carrier modulation, energy loss of complex carrier modulation is less than that of real carrier modulation. Since complex carrier modulation is able to use the right and left frequency spectrum resources adequately and has less energy loss, complex carrier modulation will certainly become the mainstream in the communication of the next generation.

The above are only preferred embodiments of the disclosure and should not be used to limit the disclosure. For those skilled in the art, the disclosure may have various modifications and changes. Any modifications, equivalent replacements, improvements and the like within the spirit and principle of the disclosure shall fall within the scope of protection of the disclosure.

The invention claimed is:

1. A method for complex carrier demodulation, comprising:
   demodulating modulated signals using complex signals as carrier signals to obtain complex carrier demodulation signals based on carrier frequency signals, multipliers and adders;
   wherein the complex carrier signals are left rotation complex carrier signals $e^{-i\omega t}$ or right rotation complex carrier signals $e^{i\omega t}$, and $e^{-i\omega t}$ and $e^{i\omega t}$ are distinguishable frequencies;
   and wherein the step of demodulating modulated signals using complex signals as carrier signals to obtain complex carrier demodulation signals comprises demodulating a first complex carrier modulation signal using $e^{i\omega_1 t}$, and demodulating a second complex carrier modulation signal using $e^{i\omega_2 t}$, where $\omega_1 = \omega_2$, and the first complex carrier modulation signal and the second complex carrier modulation signal are independent information.

2. The method according to claim 1, wherein the modulated signals are complex signals comprising real part signals and imaginary part signals.

3. The method according to claim 1, wherein when demodulating modulated signals using complex signals as carrier signals, the following formula is applied:

$$S_{RLP}(t)=S_{BP}(t)e^{-i\omega t}=(S_{LP}(t)e^{i\omega t})e^{-i\omega t}=S_{LP}(t),$$

where $S_{RLP}(t)$ represents complex carrier demodulation signals, $S_{BP}(t)$ represents complex carrier modulation signals, $S_{LP}(t)$ represents signals to be carried, $e^{i\omega t}$ represents right rotation complex carrier signals, and $e^{-i\omega t}$ represents left rotation complex carrier signals.

4. The method according to claim 3, wherein a rotation direction of the left rotation complex carrier signals accords with the left-hand rule, and a rotation direction of the right rotation complex carrier signals accords with the right-hand rule.

5. The method according to claim 1, wherein when demodulating modulated signals using complex signals as carrier signals, the following formula is applied:

$$S_{RLP}(t)=S_{BP}(t)e^{i\omega t}=(S_{LP}(t)e^{-i\omega t})e^{i\omega t}=S_{LP}(t),$$

wherein $S_{RLP}(t)$ represents complex carrier demodulation signals, $S_{BP}(t)$ represents complex carrier modulation signals, $S_{LP}(t)$ represents signals to be carried, $e^{-i\omega t}$ represents left rotation complex carrier signals, and $e^{i\omega t}$ represents right rotation complex carrier signals.

6. The method according to claim 5, wherein a rotation direction of the left rotation complex carrier signals accords with the left-hand rule, and a rotation direction of the right rotation complex carrier signals accords with the right-hand rule.

7. The method according to claim 1, wherein the modulated signals are rotation electromagnetic signals transmitted in a wire, wireless or optical fiber transmission medium.

8. The method according to claim 1, wherein the modulated signals are real signals.

9. The method according to claim 8, wherein demodulating the modulated signals using a complex signal $e^{i\omega t}$ or $e^{-i\omega t}$.

10. The method according to claim 1, wherein the modulated signals are analog signals, or discrete digital signals, or stored data;
wherein the modulated signals are signals which have been modulated for N times;
wherein the complex carrier signals are analog signals, or discrete digital signals, or stored data.

11. The method according to claim 1, wherein when a frequency of the complex carrier signals is: $\omega_C=\omega_{C1}+\omega_{C2}+\omega_{C3}+\ldots+\omega_{CN}$, demodulation is performed using complex signals with a frequency of $\omega_C$; or multiple demodulations are performed using complex carrier signals with frequencies of $\omega_{C1}, \omega_{C2}, \omega_{C3} \ldots \omega_{CN}$, wherein demodulation sequence is changeable.

12. A device for complex carrier demodulation, being configured to demodulate modulated signals using complex signals as carrier signals to obtain complex carrier demodulation signals based on carrier frequency signals, multipliers and adders, wherein the complex carrier signals are left rotation complex carrier signals $e^{-i\omega t}$ or right rotation complex carrier signals $e^{i\omega t}$, and $e^{-i\omega t}$ and $e^{i\omega t}$ are distinguishable frequencies;
wherein a first complex carrier modulation signal is demodulated using $e^{i\omega_1 t}$, and a second complex carrier modulation signal is demodulated using $e^{i\omega_2 t}$, where $\omega_1=\omega_2$, and the first complex carrier modulation signal and the second complex carrier modulation signal are independent information.

13. The device according to claim 12, comprising a complex carrier demodulation signal real part demodulation unit and a complex carrier demodulation signal imaginary part demodulation unit.

14. The device according to claim 13, wherein the real part demodulation unit comprises a first multiplier, a second multiplier and a first accumulator;
wherein:
the first multiplier is configured to multiply a real part of signals to be carried with $\cos(\omega t)$;
the second multiplier is configured to multiply an imaginary part of the signals to be carried with $-\sin(\omega t)$; and
the first accumulator is configured to perform accumulation of results of the first and second multipliers; and
wherein the imaginary part modulation unit comprises a third multiplier, a fourth multiplier and a second accumulator; wherein:
the third multiplier is configured to multiply a real part of signals to be carried with $\sin(\omega t)$;
the fourth multiplier is configured to multiply an imaginary part of the signals to be carried with $\cos(\omega t)$; and
the second accumulator is configured to perform accumulation of results of the third and fourth multipliers.

15. The device according to claim 13, wherein the real part modulation unit comprises a first multiplier, a second multiplier and a first accumulator;
wherein:
the first multiplier is configured to multiply a real part of signals to be carried with $\cos(\omega t)$;
the second multiplier is configured to multiply an imaginary parts of the signals to be carried with $\sin(\omega t)$; and
the first accumulator is configured to accumulate results of the first and second multipliers; and
wherein the imaginary part modulation unit comprises a third multiplier, a fourth multiplier and a second accumulator; wherein:
the third multiplier is configured to multiply a real part of signals to be carried with $-\sin(\omega t)$;
the fourth multiplier is configured to multiply an imaginary part of the signals to be carried with $\cos(\omega t)$ . and
the second accumulator is configured to accumulate results of the third and fourth multipliers.

* * * * *